(12) United States Patent
Bae et al.

(10) Patent No.: US 12,170,856 B2
(45) Date of Patent: Dec. 17, 2024

(54) IMAGE PROCESSING DEVICE FOR CONTROLLING PIXEL OUTPUT LEVEL AND OPERATING METHOD THEREOF

(71) Applicant: SAMSUNG ELECTRONICS CO., LTD., Suwon-si (KR)

(72) Inventors: Jaeyoung Bae, Seoul (KR); Sunyool Kang, Suwon-si (KR); Haesick Sul, Suwon-si (KR); Suyong Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 287 days.

(21) Appl. No.: 17/823,125

(22) Filed: Aug. 30, 2022

(65) Prior Publication Data
US 2023/0217129 A1   Jul. 6, 2023

(30) Foreign Application Priority Data

Jan. 6, 2022 (KR) .................. 10-2022-0002297

(51) Int. Cl.
*H04N 25/75* (2023.01)
*H01L 27/146* (2006.01)
(Continued)

(52) U.S. Cl.
CPC ....... *H04N 25/75* (2023.01); *H01L 27/14612* (2013.01); *H01L 27/14621* (2013.01);
(Continued)

(58) Field of Classification Search
CPC .... H04N 25/75; H04N 25/709; H04N 25/745; H04N 25/77; H04N 25/79; H04N 25/627;
(Continued)

(56) References Cited

U.S. PATENT DOCUMENTS

| 7,948,540 B2 | 5/2011 | Ogura et al. |
| 9,769,408 B2 | 9/2017 | Kim et al. |

(Continued)

FOREIGN PATENT DOCUMENTS

| JP | 2009-130679 | 6/2009 |
| JP | 2012-222763 | 11/2012 |

(Continued)

*Primary Examiner* — Nhan T Tran
(74) *Attorney, Agent, or Firm* — F. Chau & Associates, LLC

(57) ABSTRACT

An image sensor includes a pixel array that includes a first pixel group located in a first row and including a first select transistor and a first floating diffusion region, a second pixel group located in a second row and including a second select transistor and a second floating diffusion region, and a column line connected to both the first pixel group and the second pixel group. While charges generated by a photoelectric conversion element of the first pixel group are transferred to the first floating diffusion region, the first select transistor is turned off, the second select transistor is turned on, and a first voltage is applied to the column line through the second select transistor. A photoelectric conversion element of the second pixel group generates charges prior to the photoelectric conversion element of the first pixel group, so as to be transferred to the second floating diffusion region.

20 Claims, 12 Drawing Sheets

(51) Int. Cl.
*H04N 25/709* (2023.01)
*H04N 25/71* (2023.01)
*H04N 25/77* (2023.01)
*H04N 25/79* (2023.01)

(52) U.S. Cl.
CPC ......... *H04N 25/709* (2023.01); *H04N 25/745* (2023.01); *H04N 25/77* (2023.01); *H04N 25/79* (2023.01)

(58) Field of Classification Search
CPC .... H04N 25/778; H04N 25/779; H04N 25/59; H04N 25/44; H04N 25/585; H04N 25/616; H04N 25/11; H04N 25/766; H01L 27/14612; H01L 27/14621; H01L 27/14641
See application file for complete search history.

(56) References Cited

U.S. PATENT DOCUMENTS

| | | | |
|---|---|---|---|
| 9,888,200 B2 * | 2/2018 | Hsu | H04N 25/771 |
| 10,855,941 B2 | 12/2020 | Kawai | |
| 2009/0053848 A1 * | 2/2009 | Fan | H01L 27/14603 |
| | | | 348/308 |
| 2013/0075590 A1 * | 3/2013 | Compton | H04N 25/531 |
| | | | 250/208.1 |
| 2015/0077605 A1 * | 3/2015 | Takada | H04N 25/75 |
| | | | 348/300 |
| 2021/0144326 A1 * | 5/2021 | Sato | H04N 25/78 |

FOREIGN PATENT DOCUMENTS

| | | |
|---|---|---|
| JP | 2013-009207 | 1/2013 |
| KR | 10-2178825 | 11/2020 |

* cited by examiner

IMAGE PROCESSING DEVICE FOR CONTROLLING PIXEL OUTPUT LEVEL AND OPERATING METHOD THEREOF

CROSS-REFERENCE TO RELATED APPLICATIONS

This application claims priority under 35 U.S.C. § 119 to Korean Patent Application No. 10-2022-0002297, filed on Jan. 6, 2022 in the Korean Intellectual Property Office, the disclosure of which is incorporated by reference herein in its entirety.

TECHNICAL FIELD

Embodiments of the present disclosure described herein relate to an electronic device, and more particularly, to an image processing device that controls a pixel output level, and an operating method thereof.

DISCUSSION OF RELATED ART

An image sensor may be, for example, a charge coupled device (CCD) image sensor, a complementary metal-oxide semiconductor (CMOS) image sensor (CIS), etc. The CMOS image sensor includes pixels composed of CMOS transistors and converts light energy into an electrical signal by using a photoelectric conversion element (or device) included in each pixel. The CMOS image sensor obtains information about a captured/photographed image by using the electrical signal generated by each pixel.

SUMMARY

Embodiments of the present disclosure provide an image processing device that controls a pixel output level and an operating method thereof.

According to an embodiment, an image sensor includes a pixel array that includes a first pixel group located in a first row and including a first select transistor and a first floating diffusion region, a second pixel group located in a second row and including a second select transistor and a second floating diffusion region, and a column line connected to both the first pixel group and the second pixel group. While charges generated by a photoelectric conversion element of the first pixel group are transferred to the first floating diffusion region, the first select transistor is turned off, the second select transistor is turned on, and a first voltage is applied to the column line through the second select transistor. A photoelectric conversion element of the second pixel group generates charges prior to the photoelectric conversion element of the first pixel group, so as to be transferred to the second floating diffusion region.

According to an embodiment, an image sensor includes a pixel array that includes a first pixel group located in a first row, including a first select transistor, and corresponding to a first color filter, a second pixel group located in a second row, including a second select transistor, and corresponding to a second color filter, and a column line connected to both the first pixel group and the second pixel group, a row driver that generates control signals controlling each row of the pixel array, so as to be provided to the first pixel group and the second pixel group, and a timing controller that controls the row driver. A first unit pixel group of the first pixel group shares a first floating diffusion region, a second unit pixel group of the first pixel group shares a second floating diffusion region, and a third unit pixel group of the first pixel group shares a third floating diffusion region. While charges generated by photoelectric conversion elements of the first pixel group are transferred to the first to the third floating diffusion regions based on the control signals, the row driver turns off the first select transistor, turns on the second select transistor, and applies a first voltage to the column line through the second select transistor. Photoelectric conversion elements of the second pixel group generate charges prior to the photoelectric conversion elements of the first pixel group, so as to be transferred to corresponding floating diffusion regions. An address of the second row is determined based on an address of the first row.

According to an embodiment, an operating method of an image sensor includes comparing a reset signal of a first pixel group located in a first row with a ramp signal, applying a first voltage to a column line connected to both the first pixel group and a second pixel group located in a second row, by turning off a first select transistor of the first pixel group and turning on a second select transistor of the second pixel group, turning on a transfer transistor of the first pixel group, comparing an image signal of a pixel signal output from the first pixel group with the ramp signal, after turning on the first select transistor and turning off the transfer transistor, and applying the first voltage to the column line by turning off the first select transistor and turning on the second select transistor. An address of the second row is determined based on an address of the first row.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
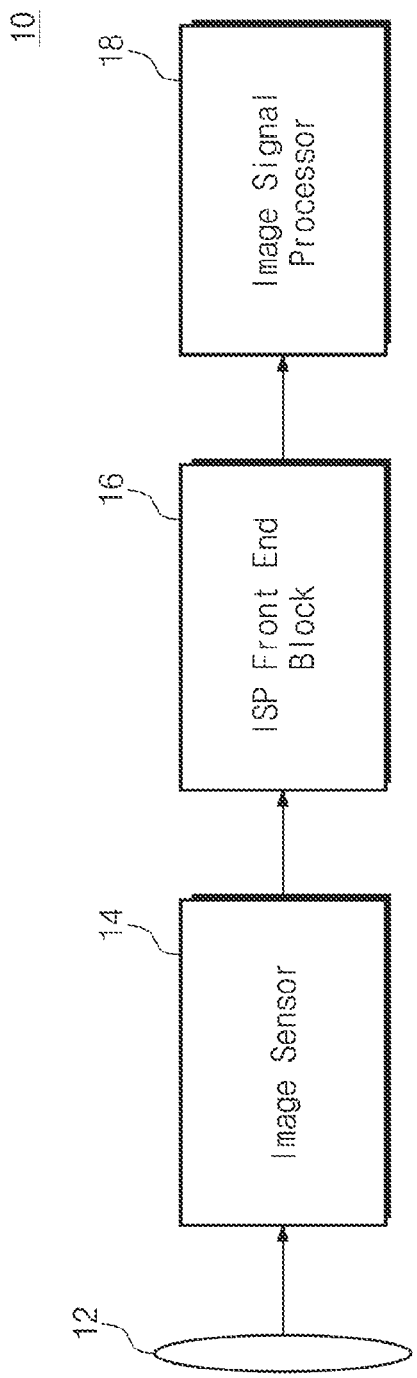
FIG. 1 illustrates an example of a configuration of an image processing block according to an embodiment of the present disclosure.

Embodiments of the present disclosure will be described more fully hereinafter with reference to the accompanying drawings. Like reference numerals may refer to like elements throughout the accompanying drawings.

In the detailed description, components described with reference to the terms "unit", "module", "block", "~er or ~or", etc., and function blocks illustrated in drawings, will be implemented with software, hardware, or a combination thereof. For example, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

It will be understood that when a component is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. Other words used to describe the relationships between components should be interpreted in a like fashion.

FIG. 1 illustrates an example of a configuration of an image processing block 10 according to an embodiment of the present disclosure. The image processing block 10 may be implemented as a part of various electronic devices such as, for example, a smartphone, a digital camera, a laptop computer, a desktop computer, etc. The image processing block 10 may include a lens 12, an image sensor 14, an image signal processor (ISP) front end block 16, and an image signal processor 18.

Light may be reflected from an object, scenery, etc. targeted for photographing, and the lens 12 may receive the reflected light. The image sensor 14 may generate an electrical signal based on the light received through the lens 12. For example, the image sensor 14 may be implemented with a complementary metal-oxide semiconductor (CMOS) image sensor or the like. For example, the image sensor 14 may be a multi-pixel image sensor having a dual pixel structure or a tetracell structure.

The image sensor 14 may include a pixel array. Pixels of the pixel array may convert a light into electrical signals to generate pixel values. In addition, the image sensor 14 may include an analog-to-digital converting (ADC) circuit for performing a correlated double sampling (CDS) operation on the pixel values. A configuration of the image sensor 14 will be described in more detail with reference to FIG. 2.

The ISP front end block 16 may perform pre-processing on an electrical signal output from the image sensor 14 so as to be appropriate for processing by the image signal processor 18.

The image signal processor 18 may generate image data associated with the photographed object and/or scenery by appropriately processing the electrical signal processed by the ISP front end block 16. To this end, the image signal processor 18 may perform various processing operations such as, for example, color correction, auto white balance, gamma correction, color saturation correction, bad pixel correction, and hue correction.

One lens 12 and one image sensor 14 are illustrated in FIG. 1. However, embodiments are not limited thereto. For example, in an embodiment, the image processing block 10 may include a plurality of lenses, a plurality of image sensors, and a plurality of ISP front end blocks. In this case, the plurality of lenses may have different fields of view. Also, the plurality of image sensors may have different functions, different performances, and/or different characteristics, and may respectively include pixel arrays of different configurations.

Figure 2:
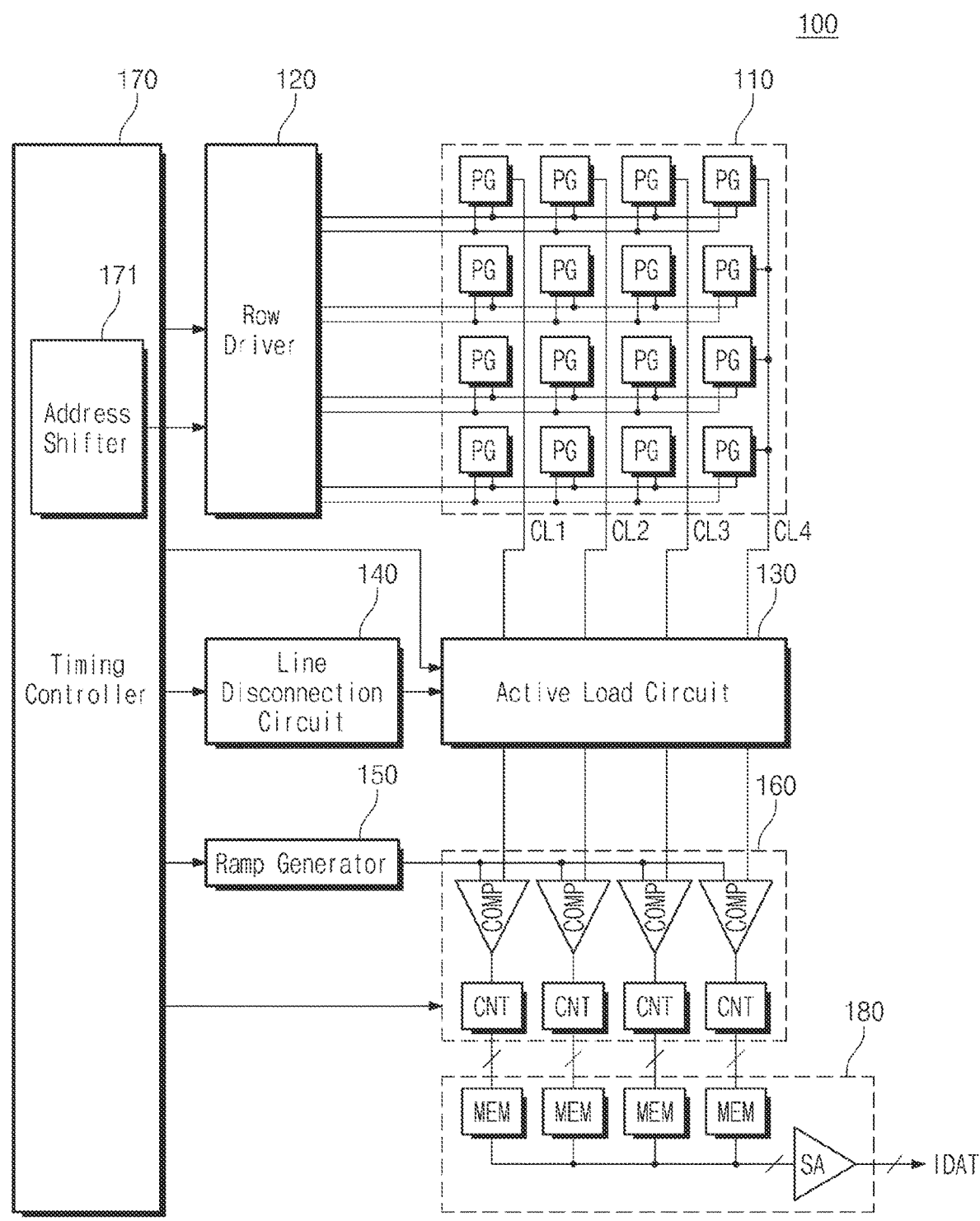
FIG. 2 illustrates an example of a configuration of an image sensor of FIG. 1.

FIG. 2 illustrates an example of a configuration of the image sensor 14 of FIG. 1. An image sensor 100 may include a pixel array 110, a row driver 120, an active load circuit 130, a line disconnection circuit 140, a ramp signal generator 150, an ADC circuit 160, a timing controller 170, and a buffer 180.

The pixel array 110 may include a plurality of pixels arranged in rows and columns, that is, in the form of a matrix. Each of the plurality of pixels may include a photoelectric conversion element. For example, the photoelectric conversion element may include a photo diode, a photo transistor, a photo gate, a pinned photo diode, etc.

The pixel array 110 may include a plurality of pixel groups PG. Each pixel group PG may include two or more pixels, that is, a plurality of pixels. A plurality of pixels constituting a pixel group PG may share one floating diffusion region or a plurality of floating diffusion regions. An example in which the pixel array 110 includes pixel groups PG arranged in the form of a matrix with four rows and four columns (e.g., includes 4×4 pixel groups PG) is illustrated in FIG. 2. However, embodiments of the present disclosure are not limited thereto.

The pixel group PG may include pixels of the same color. For example, the pixel group PG may include a red pixel to convert a light of a red spectrum into an electrical signal, a green pixel to convert a light of a green spectrum into an electrical signal, or a blue pixel to convert a light of a blue spectrum into an electrical signal. For example, the pixels constituting the pixel array 110 may be arranged in the form of a tetra-Bayer pattern.

The pixels of the pixel array 110 may output pixel signals through column lines CL1 to CL4, depending on the intensity or the amount of light received from outside of the electronic device. For example, the pixel signal may be an analog signal corresponding to the intensity or the amount of light received from outside of the electronic device. The pixel signals may pass through voltage buffers (e.g., source followers) and may then be provided to the ADC circuit 160 through the column lines CL1 to CL4 and the active load circuit 130.

For example, to control a pixel output level, the pixel array 110 according to embodiments of the present disclosure may be configured to adjust voltage levels of the column lines CL1 to CL4 to a desired voltage level under control of the row driver 120 and the timing controller 170. For example, a voltage level of a column line connected to a pixel that is generating a pixel signal may be adjusted to a desired voltage level based on an operation of another pixel that is located in another row adjacent to the pixel, does not generate a pixel signal, and is connected to the same column line.

The row driver 120 may select and drive a row of the pixel array 110. The row driver 120 may decode an address generated by the timing controller 170 and may generate control signals for selecting and driving a row of the pixel array 110. For example, the control signals may include a signal for selecting a pixel, a signal for resetting a floating diffusion region, etc. The row driver 120 may include latch circuits for storing addresses, and logic circuits for providing control signals to the pixel array 110.

The active load circuit 130 may individually enable or disable the column lines CL1 to CL4 connected to the pixels of the pixel array 110 under control of the timing controller 170. For example, the active load circuit 130 may include switches (e.g., transistors) respectively connected to the column lines CL1 to CL4. For example, each of the switches may be controlled in response to a control signal output from the timing controller 170 and may operate as a current source that uniformly maintains a current flowing from each of the column lines CL1 to CL4 to a ground terminal through each switch.

Figure 7A:
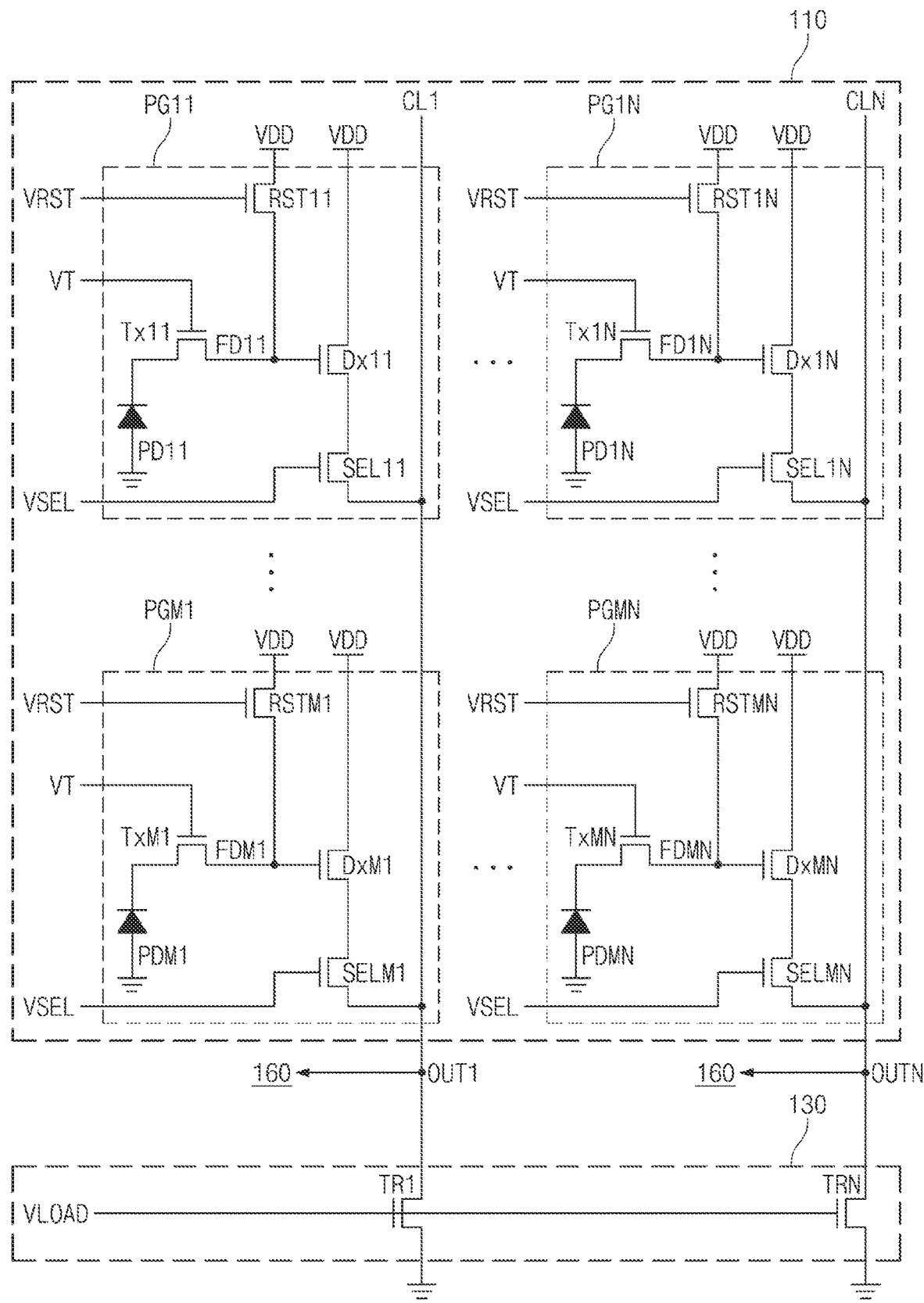
FIG. 7A is a circuit diagram illustrating a pixel array and an active load circuit of FIG. 2 together.

To control pixel output levels of the column lines CL1 to CL4 connected to the pixel array 110, the line disconnection circuit 140 may adjust the voltage levels of the column lines CL1 to CL4 to a desired voltage level under control of the timing controller 170. In embodiments of the present disclosure, the image sensor 100 does not include the line disconnection circuit 140 as illustrated in FIG. 7A. In this case, the image sensor 100 may control the control signals to be applied to each pixel group for the purpose of adjusting voltage levels of the column lines CL1 to CL4 connected to the pixel array 110.

For example, the image sensor 100 according to embodiments of the present disclosure may selectively perform a method in which the line disconnection circuit 140 adjusts voltage levels of the column lines CL1 to CL4, and a method in which the pixel array 110 adjusts voltage levels of the column lines CL1 to CL4 (e.g., a method of controlling control signals to be applied to pixel groups). For example, a register that is capable of enabling one of the two methods described above may be set by the timing controller 170.

The ramp signal generator 150 may generate a ramp signal RAMP (refer to FIG. 10) under control of the timing controller 170. For example, the ramp signal generator 150 may operate in response to a control signal such as a ramp enable signal. When the ramp enable signal is activated, the ramp signal generator 150 may generate the ramp signal RAMP depending on preset values (e.g., a start level, an end level, and a slope). For example, the ramp signal RAMP may be a signal that increases or decreases along a preset slope during a specific time. The ramp signal RAMP may be provided to the ADC circuit 160.

The ADC circuit 160 may receive pixel signals from the plurality of pixels of the pixel array 110 through the column lines CL1 to CL4 and the active load circuit 130, and may receive the ramp signal RAMP from the ramp signal generator 150. The ADC circuit 160 may operate based on a correlated double sampling (CDS) technique for obtaining a reset signal and an image signal from received pixel signals and extracting a difference between the reset signal and the image signal as an effective signal component. The ADC circuit 160 may include a plurality of comparators COMP and a plurality of counters CNT.

For example, each of the comparators COMP may compare the reset signal of the pixel signal and the ramp signal RAMP, may compare the image signal of the pixel signal and the ramp signal RAMP, and may perform correlated double sampling (CDS) on the comparison results. Each of the counters CNT may count pulses of the signal undergoing the correlated double sampling and may output a counting result as a digital signal. An example in which the ADC circuit 160 includes four comparators COMP and four counters CNT is illustrated in FIG. 2, but embodiments of the present disclosure are not limited thereto.

The timing controller 170 may generate an address, a control signal, and/or a clock for controlling an operation and/or a timing of each of the row driver 120, the active load circuit 130, the line disconnection circuit 140, the ramp signal generator 150, and the ADC circuit 160. The timing controller 170 may include the register capable of enabling one of the two methods for adjusting voltage levels of the column lines CL1 to CL4.

In addition, the timing controller 170 may include an address shifter 171 for performing an operation of adjusting voltage levels of the column lines CL1 to CL4 by the pixel array 110. For example, the address shifter 171 may determine an address of a pixel adjacent to a pixel that is generating a read pixel signal and may provide the determined address to the row driver 120.

The buffer 180 may include memories MEMs and sense amplifiers SA. The memories MEM may store digital signals output from the corresponding counters CNT of the ADC circuit 160. The sense amplifiers SA may sense and amplify the digital signals stored in the memories MEMs. The sense amplifiers SA may output the amplified digital signals as image data IDAT, and the image data IDAT may be provided to the ISP front end block 16 of FIG. 1.

Figure 3:
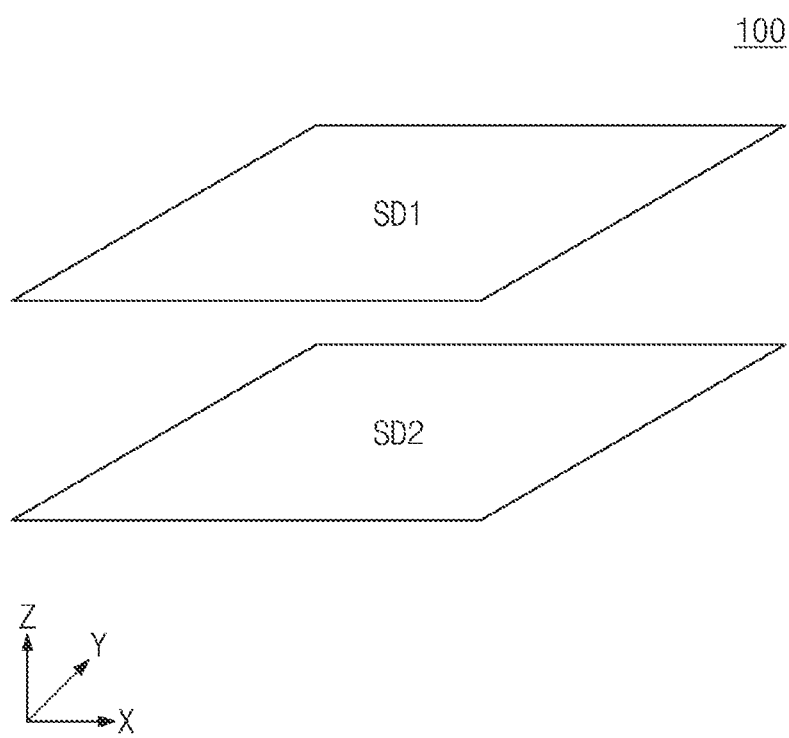
FIG. 3 illustrates an example of a stack-type structure of an image sensor of FIG. 2.

The image sensor 100 may have a stack-type structure. FIG. 3 illustrates an example of a stack-type structure of the image sensor 100 of FIG. 2. Referring to FIG. 3, the image sensor 100 may have a structure in which at least two semiconductor substrates that include a first semiconductor substrate SD1 and a second semiconductor substrate SD2 under the first semiconductor substrate SD1 are stacked in a vertical direction "Z". A row direction "X" and a column direction "Y" may be directions that are at right angles and are parallel to a surface of a semiconductor substrate.

Pads may be formed on a lower surface of the first semiconductor substrate SD1 and an upper surface of the second semiconductor substrate SD2 such that locations of the pads coincide with each other. The first semiconductor substrate SD1 and the second semiconductor substrate SD2 may be electrically connected to each other through the pads. For example, the pixel array 110 of FIG. 2 may be formed on the first semiconductor substrate SD1, and the remaining components other than the pixel array 110 of FIG. 2 may be formed on the second semiconductor substrate SD2.

For example, the first semiconductor substrate SD1 may receive control signals generated by logic circuits of the row driver 120 of FIG. 2 formed on the second semiconductor substrate SD2 through pads, and may output pixel signals to the second semiconductor substrate SD2 through pads corresponding to column lines of the pixel array 110.

Figure 4:
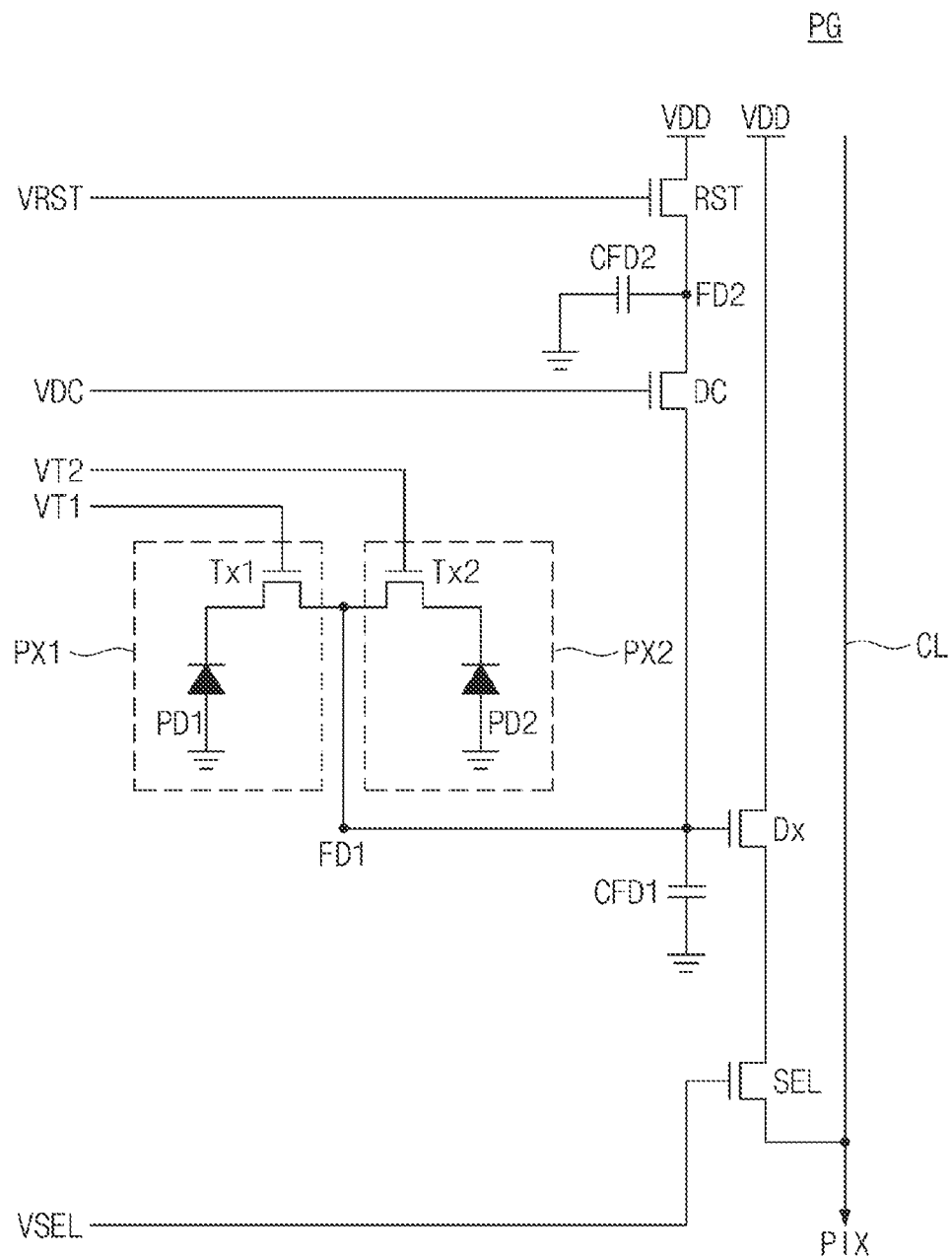
FIG. 4 is a circuit diagram illustrating an example of one of pixel groups of a pixel array of FIG. 2.

FIG. 4 is a circuit diagram illustrating an example of one of the pixel groups PG of the pixel array 110 of FIG. 2. For example, the pixel group PG may include pixels PX1 to PX2, photoelectric conversion elements PD1 to PD2, transfer transistors Tx1 and Tx2, a reset transistor RST, a dual conversion transistor DC, a drive transistor Dx, and a select transistor SEL.

An example in which the pixel group PG has a structure in which the two pixels PX1 and PX2 include the photoelectric conversion elements PD1 and PD2 respectively is illustrated in FIG. 4, but embodiments of the present disclosure are not limited thereto. For example, the pixel group PX may be implemented to have various different structures.

The first pixel PX1 may include the first photoelectric conversion element PD1 and the first transfer transistor Tx1, and the second pixel PX2 may include the same or similar components/elements. The pixels PX1 and PX2 may share the reset transistor RST, the dual conversion transistor DC, the drive transistor Dx, and the select transistor SEL. Also, the pixels PX1 and PX2 may share a first floating diffusion region FD1.

The first floating diffusion region FD1 or a second floating diffusion region FD2 may accumulate (or integrate) charges corresponding to the amount of incident light. While the transfer transistors Tx1 and Tx2 are respectively turned on by transfer signals VT1 and VT2, the first floating diffusion region FD1 or the second floating diffusion region FD2 may accumulate (or integrate) charges supplied from the photoelectric conversion elements PD1 to PD2. Because the first floating diffusion region FD1 is connected to a gate terminal of the drive transistor Dx operating as a source follower amplifier, a voltage corresponding to the charges accumulated at the first floating diffusion region FD1 may be formed. For example, a capacitance of the first floating diffusion region FD1 is depicted as a first capacitance CFD1.

The dual conversion transistor DC may be driven by a dual conversion signal VDC. When the dual conversion transistor DC is turned off, the capacitance of the first floating diffusion region FD1 may correspond to the first capacitance CFD1. In a general environment, because the first floating diffusion region FD1 is not easily saturated, there may be no need to increase the capacitance (e.g., CFD1) of the first floating diffusion region FD1. In this case, the dual conversion transistor DC may be turned off.

However, in a high-illuminance environment, the first floating diffusion region FD1 may be easily saturated. To prevent such saturation, the dual conversion transistor DC may be turned on such that the first floating diffusion region FD1 and the second floating diffusion region FD2 are electrically connected. In this case, a capacitance of the floating diffusion regions FD1 and FD2 may be increased to a sum of the first capacitance CFD1 and a second capacitance CFD2.

The transfer transistors Tx1 and Tx2 may be respectively driven by the transfer signals VT1 and VT2, and may transfer charges generated (or integrated) by the photoelectric conversion elements PD1 to PD2 to the first floating diffusion region FD1 or the second floating diffusion region FD2. For example, first ends of the transfer transistors Tx1 and Tx2 may be respectively connected to the photoelectric conversion elements PD1 to PD2, and second ends thereof may be connected in common with the first floating diffusion region FD1.

The reset transistor RST may be driven by a reset signal VRST and may provide a power supply voltage VDD to the first floating diffusion region FD1 or the second floating diffusion region FD2. As such, the charges accumulated at the first floating diffusion region FD1 or the second floating diffusion region FD2 may move to a terminal for the power supply voltage VDD, and a voltage of the first floating diffusion region FD1 or the second floating diffusion region FD2 may be reset.

The drive transistor Dx may amplify a voltage of the first floating diffusion region FD1 or the second floating diffusion region FD2 and may generate a pixel signal PIX corresponding to a result of the amplification. The select transistor SEL may be driven by a selection signal VSEL and may select pixels to be read in units of row. When the select transistor SEL is turned on, the pixel signal PIX may be output to the ADC circuit 160 of FIG. 2 through a column line CL.

The above operation in which a voltage corresponding to the amount of charges transferred from the pixels PX1 and PX2 to the first floating diffusion region FD1 or the second floating diffusion region FD2 through the drive transistor Dx and the select transistor SEL for the purpose of outputting the pixel signal PIX is referred to as a "readout operation." Also, an operation in which the transfer transistors Tx1 and Tx2 are turned on or turned off for the photoelectric conversion elements PD1 and PD2 to accumulate charges in response to a light incident from outside of the electronic device is referred to as a "shutter operation."

According to embodiments, when the transfer transistors Tx1 and Tx2 are respectively turned on by the transfer signals VT1 and VT2, a potential of the first floating diffusion region FD1 or the second floating diffusion region FD2 may change. In this case, a voltage level of the column line CL may be affected by the coupling between the first floating diffusion region FD1 or the second floating diffusion region FD2 and the gate of the drive transistor Dx. In the case where the line disconnection circuit 140 is disabled, to prevent the coupling, the select transistor SEL may be turned off while the transfer transistors Tx1 and Tx2 are turned on. In the case where the select transistor SEL is turned off, the column line CL may be in a floating state, and thus, may have an arbitrary voltage level.

Similarly, a column line that is connected to another pixel group not illustrated in FIG. 4 may be in a floating state while a select transistor corresponding to the another pixel group is turned off, and thus, may have an arbitrary voltage level. Accordingly, when select transistors of the pixel array 110 are turned off, column lines (e.g., the column lines CL1 to CL4 of FIG. 2) may have arbitrary different voltage levels. In this case, when the select transistors are turned on again, voltage levels of the column lines may have different settling times. For this reason, the accuracy of correlated double sampling (CDS) for each column line may decrease, and a dynamic range of an image sensor may also decrease.

Accordingly, to prevent column lines from having different voltages when select transistors are turned off, the image sensor 100 according to embodiments of the present disclosure may adjust a voltage level of each column line to a desired voltage level through an operation of the pixel array 110 and/or the line disconnection circuit 140 as described with reference to FIG. 2. For example, the desired voltage level may be determined based on a voltage level of a reset floating diffusion region in a pixel group. As a result, column lines may be prevented from having different voltages when select transistors are turned off. The manner in which a voltage level of a column line is adjusted according to an embodiment of the present disclosure will be described in detail with reference to FIGS. 7A, 7B, and 8 to 10.

Figure 5:
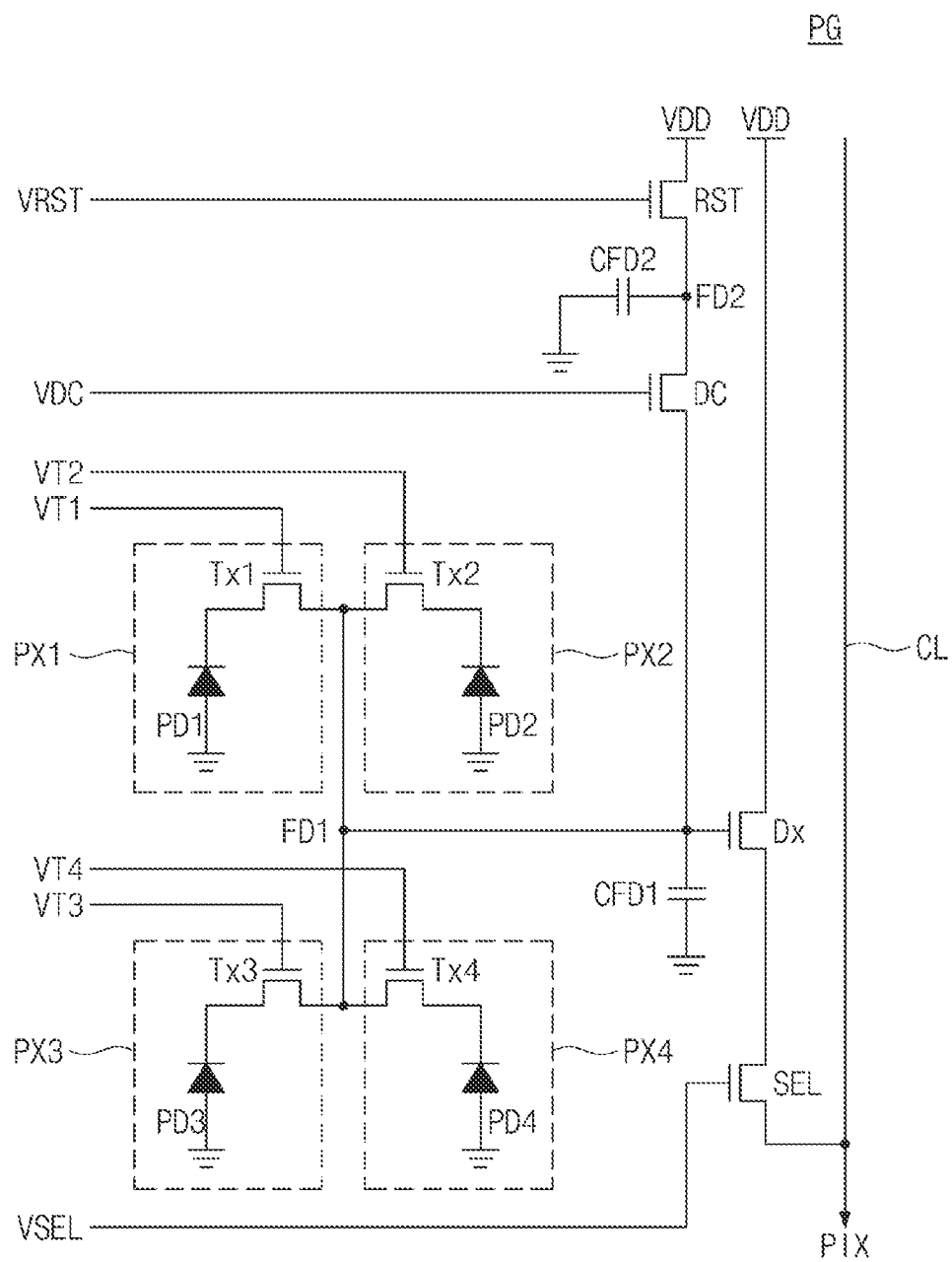
FIG. 5 is a circuit diagram illustrating an example of one of pixel groups of a pixel array of FIG. 2.

FIG. 5 is a circuit diagram illustrating an example of one of the pixel groups PG of the pixel array 110 of FIG. 2. Referring to FIG. 5, the pixel group PG may include pixels PX1 to PX4, photoelectric conversion elements PD1 to PD4, transfer transistors Tx1 to Tx4, a reset transistor RST, a dual conversion transistor DC, a drive transistor Dx, and a select transistor SEL.

The first pixel PX1 may include the first photoelectric conversion element PD1 and the first transfer transistor Tx1, and each of the remaining pixels PX2, PX3, and PX4 may include the same or similar components/elements. The pixels PX1 to PX4 may share the reset transistor RST, the dual conversion transistor DC, the drive transistor Dx, and the select transistor SEL. Also, the pixels PX1 to PX4 may share a first floating diffusion region FD1.

The expansion of the capacitance of the first floating diffusion region FD1 by the dual conversion transistor DC, the operation of the transfer transistors Tx1 to Tx4, the operations of the reset transistor RST, the drive transistor Dx, and the select transistor SEL, and a voltage level change of the column line CL according to the turn-on/turn-off of the select transistor SEL may be the same as or mostly similar to those described with reference to FIG. 4. Thus, for convenience of explanation, a further description thereof will be omitted.

Figure 6:
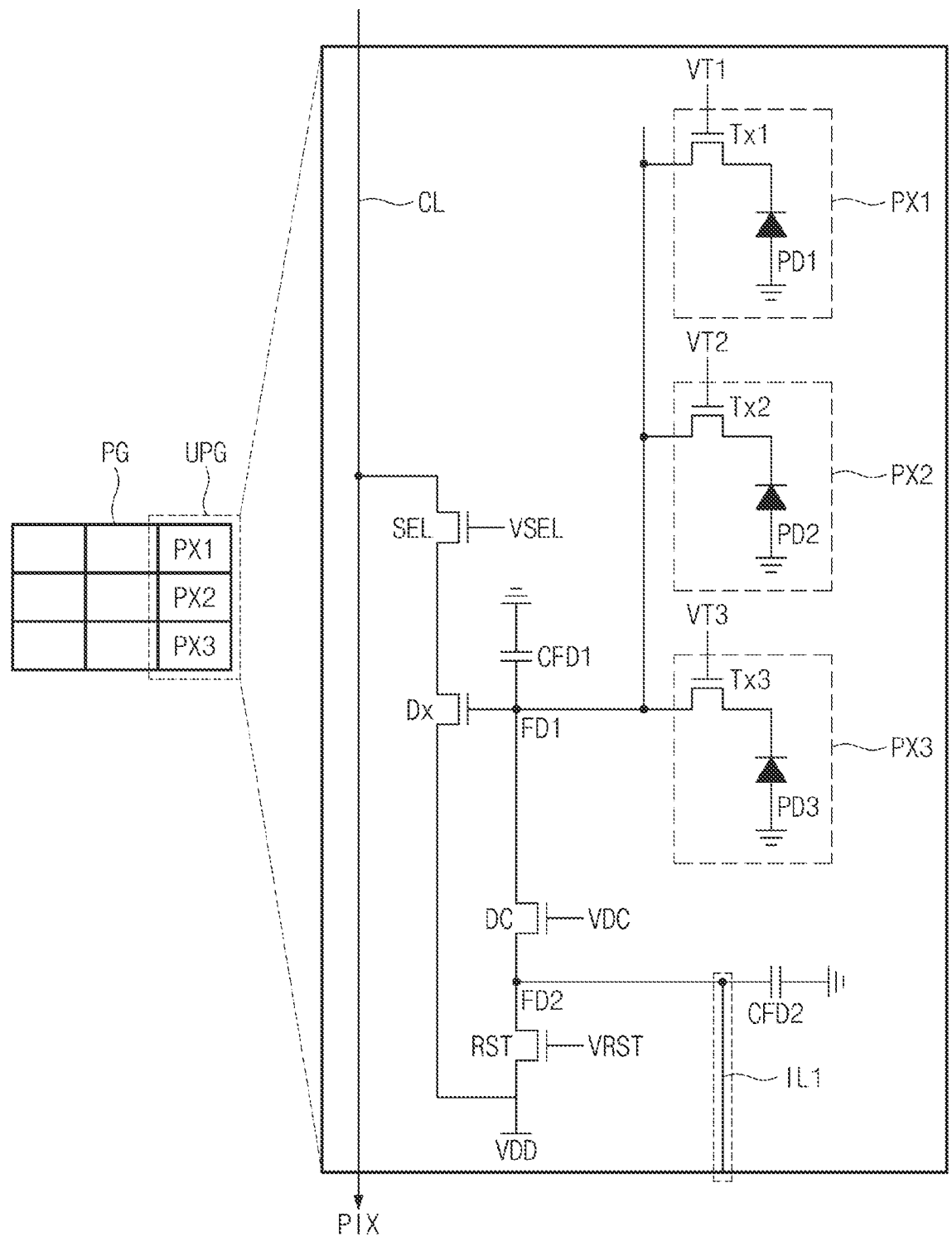
FIG. 6 is a circuit diagram illustrating an example of one of pixel groups of a pixel array of FIG. 2.

FIG. 6 is a circuit diagram illustrating an example of one of the pixel groups PG of the pixel array 110 of FIG. 2. Referring to FIG. 6, the pixel group PG may include three unit pixel groups UPG, and each unit pixel group UPG includes three pixels PX1 to PX3. The first pixel PX1 may include a first photoelectric conversion element PD1 and a first transfer transistor Tx1, and each of the remaining pixels PX2 and PX3 may include the same or similar components/elements. The pixels PX1 to PX3 may share a reset transistor RST, a dual conversion transistor DC, a drive transistor Dx, and a select transistor SEL. Also, the pixels PX1 to PX3 may share a first floating diffusion region FD1.

The expansion of the capacitance of the first floating diffusion region FD1 by the dual conversion transistor DC, the operation of the transfer transistors Tx1 to Tx3, the operations of the reset transistor RST, the drive transistor Dx, and the select transistor SEL, and a voltage level change of the column line CL according to the turn-on/turn-off of the select transistor SEL may be the same as or mostly similar to those described with reference to FIG. 4. Thus, for convenience of explanation, a further description thereof will be omitted.

A second floating diffusion region FD2 may be electrically connected to a floating diffusion region of an adjacent unit pixel group through a connecting line IL1. In this case, the capacitance of the first floating diffusion region FD1 may be further increased (or expanded). According to embodiments of the present disclosure, the unit pixel group UPG may further include a switching element (e.g., an element such as the dual conversion transistor DC) for electrically connecting the second floating diffusion region FD2 with the floating diffusion region of the adjacent unit pixel group.

Figure 7B:
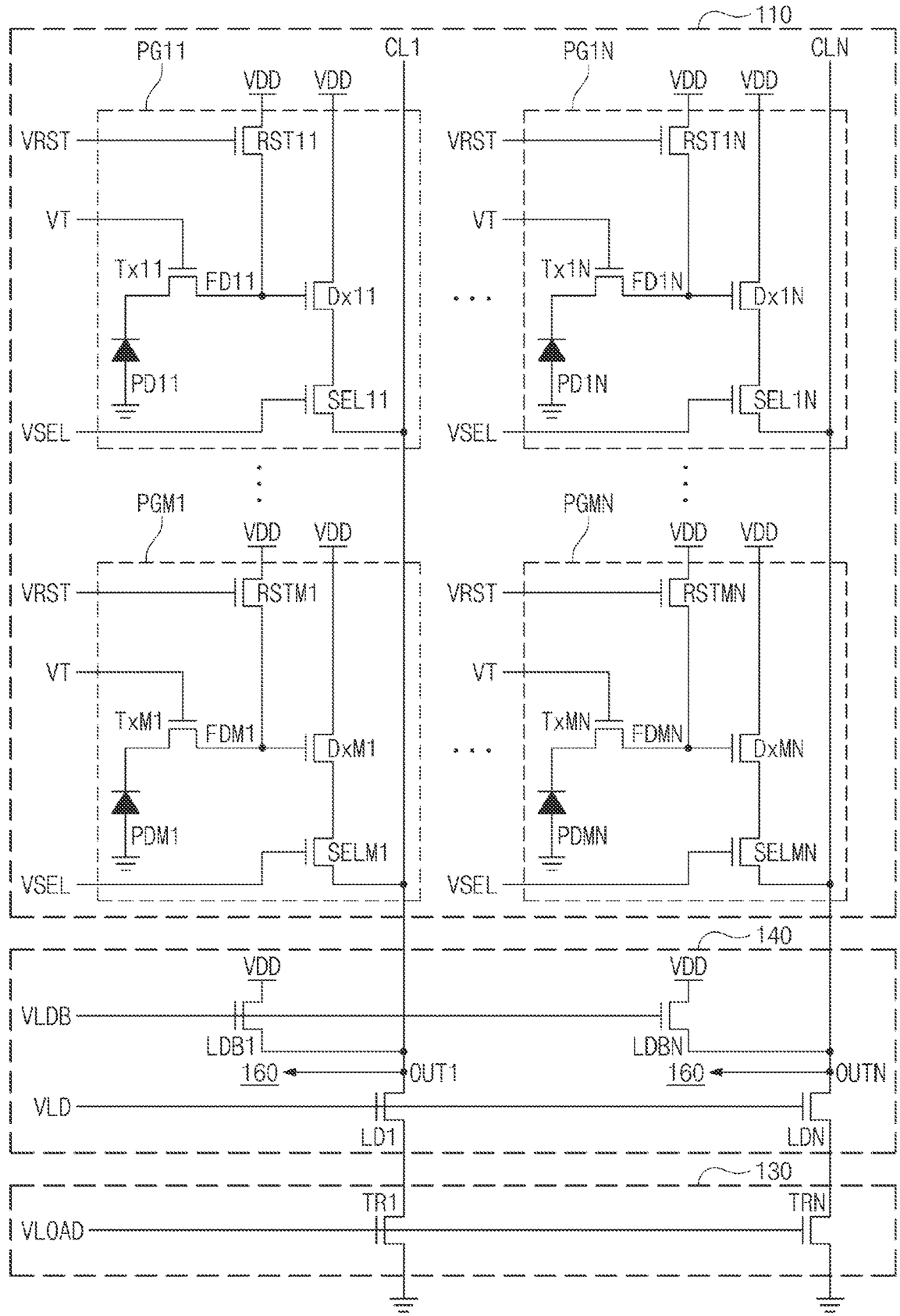
FIG. 7B is a circuit diagram illustrating a pixel array, an active load circuit, and a line disconnection circuit of FIG. 2 together.

FIG. 7A is a circuit diagram illustrating the pixel array 110 and the active load circuit 130 of FIG. 2 together, and FIG. 7B is a circuit diagram illustrating the pixel array 110, the active load circuit 130, and the line disconnection circuit 140 of FIG. 2 together.

For example, FIG. 7A shows an embodiment in which the image sensor 100 of FIG. 2 does not include the line disconnection circuit 140, and FIG. 7B shows an embodiment in which the image sensor 100 of FIG. 2 includes the line disconnection circuit 140. Referring to FIG. 3, the pixel array 110 may be implemented on the first semiconductor substrate SD1 of the image sensor 100, and the active load circuit 130 and the line disconnection circuit 140 may be implemented on the second semiconductor substrate SD2.

As an example, pixel groups PG11, PG1N, PGM1, and PGMN are illustrated in FIGS. 7A and 7B under the assumption that the pixel array 110 includes pixel groups arranged in the form of a matrix with M rows and N columns (e.g., M×N pixel groups, in which M and N are positive integers). Also, for brevity of illustration, it is assumed that each of the pixel groups PG11 to PGMN includes one photoelectric conversion element and one transfer transistor. However, embodiments of the present disclosure are not limited thereto. For example, the pixel groups PG11 to PGMN may be implemented as one of the pixel groups illustrated in FIGS. 4 to 6 according to embodiments.

Configurations and operations (e.g., charge integration of floating diffusion regions FD11 to FDMN, and operations of reset transistors RST11 to RSTMN, drive transistors Dx11 to DxMN, and select transistors SEL11 to SELMN) of the pixel groups PG11 to PGMN are the same as or similar to those described with reference to FIGS. 4 to 6. Thus, for convenience of explanation, a further description thereof will be omitted.

The active load circuit 130 may include transistors TR1 to TRN that are respectively connected to column lines CL1 to CLN of the pixel array 110. The transistors TR1 to TRN may be turned on in response to a load voltage VLOAD and may operate as a current source. For example, the load voltage VLOAD may be provided under control of the timing controller 170 of FIG. 2.

For example, the transistors TR1 to TRN may be turned on by the load voltage VLOAD of a high level and may operate as a current source, and a pixel signal output from the pixel group PG11 and PGM1 connected to the column line CL1 may be provided to the ADC circuit 160. In this case, a level of the output pixel signal may be about equal to a level of an output voltage OUT1.

As described with reference to FIG. 4, when the transfer transistors Tx11 to TxMN are turned on in response to the transfer signal VT, voltage levels of the column lines CL1 to CLN may be affected by the coupling between the floating diffusion regions FD11 to FDMN and the gates of the drive transistors Dx11 to DxMN. To prevent such coupling, the select transistors SEL11 to SELMN may be turned off while the transfer transistors Tx11 to TxMN are turned on.

For example, when the select transistor SEL11 or the select transistor SELM1 is turned off, the column line CL1 may be in a floating state, and thus, may have an arbitrary voltage level (e.g., a first voltage level). Similarly, when the select transistor SEL1N or the select transistor SELMN is turned off, the column line CLN may be in a floating state, and thus, may have an arbitrary voltage level (e.g., an N-th voltage level). In this case, the first voltage level and the N-th voltage level may be different from each other. For example, when the select transistors SEL11 to SELMN are turned off, the column lines CL1 to CLN may have arbitrary different voltage levels.

After the pixel signal is transferred to the ADC circuit 160, to perform processing for outputting a pixel signal of pixel groups located in another row, turned-off select transistors corresponding to the pixel groups located in another row should be turned on again. For example, upon performing processing that allows the pixel groups PGM1 to PGMN in an M-th row to output pixel signals, the select transistors SELM1 to SELMN should be turned on again.

In the case where voltage levels of the column lines CL1 to CLN are different from each other when the select transistors SELM1 to SELMN are turned on again, voltage levels of the column lines CL1 to CLN may have different settling times. In the case where voltage levels of the column lines CL1 to CLN have different settling times, the accuracy of correlated double sampling (CDS) for each of the column lines CL1 to CLN may decrease, and a dynamic range of an image sensor may also decrease.

To prevent the above issue, the pixel array 110 according to embodiments of the present disclosure may adjust voltage levels of the column lines CL1 to CLN to a desired voltage level such that the voltage levels of the column lines CL1 to CLN are equally set before the select transistors SELM1 to SELMN are turned on. For example, voltage levels of the column lines CL1 to CLN may correspond to levels of output voltages OUT1 to OUTN (e.g., pixel output levels).

For example, voltage levels of column lines connected to pixel groups of a row that are generating pixel signals (e.g., pixel groups that are performing the readout operation) may be adjusted to a desired voltage level based on operations of pixel groups that are located in an adjacent different row and are not generating pixel signals (e.g., pixel groups that have already performed the readout operation). For example, the pixel array 110 may adjust voltage levels of the column lines CL1 to CLN (e.g., voltage levels of the output voltages OUT1 to OUTN) based on voltage levels of reset floating diffusion regions of pixel groups that do not generate pixel signals.

The above operation of the pixel array 110 may be performed under control of a row driver (e.g., 120 in FIG. 2) and a timing controller (e.g., 170 in FIG. 2). An operation in which a pixel output level is controlled by the pixel array 110 according to embodiments of the present disclosure is referred to as an "in-pixel LDB (IPL) operation". As the IPL operation is used, column lines may be prevented from being floated by only using transistors on a semiconductor substrate in which the pixel array 110 is formed. This will be described in further detail with reference to FIGS. 8 to 10.

The line disconnection circuit 140 of FIG. 7B may perform a pixel output level control operation to be the same as or similar to the IPL operation of the pixel array 110 described above. For example, the line disconnection circuit 140 may include a plurality of transistors LD1 to LDN and LDB1 to LDBN for adjusting voltage levels of the column lines CL1 to CLN to a desired voltage level. As described with reference to FIG. 3, the plurality of transistors LD1 to LDN and LDB1 to LDBN may be formed in the second semiconductor substrate SD2 different from the first semiconductor substrate SD1 in which the pixel array 110 is formed.

The transistors LD1 to LDN may be turned on or turned off in response to a line disconnection signal VLD, and the transistors LDB1 to LDBN may be turned on or turned off in response to an inverted line disconnection signal VLDB. The line disconnection signal VLD and the inverted line disconnection signal VLDB may be provided, for example, under control of the timing controller 170 of FIG. 2.

For example, voltage levels of the line disconnection signal VLD and the inverted line disconnection signal VLDB may be opposite to each other. That is, when the voltage level of the line disconnection signal VLD is the high level, the voltage level of the inverted line disconnection signal VLDB may be the low level. In contrast, when the voltage level of the line disconnection signal VLD is the low level, the voltage level of the inverted line disconnection signal VLDB may be the high level.

For example, first ends of the transistors LD1 to LDN may be connected to the transistors TR1 to TRN of the active load circuit 130, and second ends thereof may be supplied with a ground voltage. Also, first ends of the transistors LDB1 to LDBN may be supplied with the power supply voltage VDD, and second ends thereof may be connected to the transistors TR1 to TRN of the active load circuit 130 and the column lines CL1 to CLN.

While pixel signals output from pixel groups of one row of the pixel array 110 are transferred to the ADC circuit 160, the transistors LD1 to LDN may be turned on in response to the line disconnection signal VLD of the high level, and the transistors LDB1 to LDBN may be turned off in response to the inverted line disconnection signal VLDB of the low level. In this case, according to an embodiment, the pixel signals whose levels are the same as levels of the output voltages OUT1 to OUTN may be transferred to the ADC circuit 160, and voltage levels of the column lines CL1 to CLN are not separately adjusted.

The line disconnection circuit 140 may adjust voltage levels of the column lines CL1 to CLN to a desired voltage level such that the voltage levels of the column lines CL1 to CLN are equally set before the select transistors SELM1 to SELMN are turned on. For example, the voltage levels of the column lines CL1 to CLN may correspond to levels of output voltages OUT1 to OUTN (e.g., pixel output levels). To adjust a voltage level, the transistors LDB1 to LDBN may be turned on in response to the inverted line disconnection signal VLDB of the high level.

Before select transistors of pixel groups corresponding to a row targeted for processing for a pixel output are turned on, the turned-on transistors LDB1 to LDBN may adjust voltage levels of the column lines CL1 to CLN (e.g., voltage levels of the output voltages OUT1 to OUTN) based on voltage levels of corresponding reset floating diffusion regions. In this case, the transistors LD1 to LDN may be turned off in response to the line disconnection signal VLD of the low level.

As described above, the line disconnection circuit 140 may control a pixel output level of the pixel array 110. However, as described with reference to FIG. 3, because the line disconnection circuit 140 is implemented on the second semiconductor substrate SD2 and the pixel array 110 is implemented on the first semiconductor substrate SD1, voltage levels of the column lines CL1 to CLN may not be uniformly adjusted by the line disconnection circuit 140 depending on a process of treating a semiconductor substrate. Also, because distances between pixel groups of respective rows and the transistors LDB1 to LDBN are different, it may be different to accurately adjust voltage levels of the column lines CL1 to CLN based on voltage levels of reset floating diffusion regions of pixel groups located in another row.

In contrast, according to embodiments of the present disclosure, because pixel groups of the pixel array 110 are implemented on the same semiconductor substrate (e.g., the first semiconductor substrate SD1), a function of adjusting voltage levels of column lines is not affected by the process of treating a semiconductor substrate. Also, with regard to all of the pixel groups, the pixel array 110 may adjust voltage levels of column lines based on an operation of pixel groups located in a row spaced therefrom by as much as a given distance, and thus, a location of a pixel group may have no influence on the function of adjusting voltage levels of column lines. Accordingly, the IPL operation of the pixel array 110 may supplement a nonuniform operation of the line disconnection circuit 140.

As described with reference to FIG. 2, the image sensor 100 according to embodiments of the present disclosure may selectively perform a pixel output level control operation by the pixel array 110 or the line disconnection circuit 140. For example, in the case of an embodiment according to FIG. 7A in which the line disconnection circuit 140 is not included, the pixel output level control operation may be performed only by the pixel array 110. In contrast, in the case of an embodiment according to FIG. 7B in which the line disconnection circuit 140 is included, the pixel output level control operation may be performed by the pixel array 110 or the line disconnection circuit 140.

Figure 8:
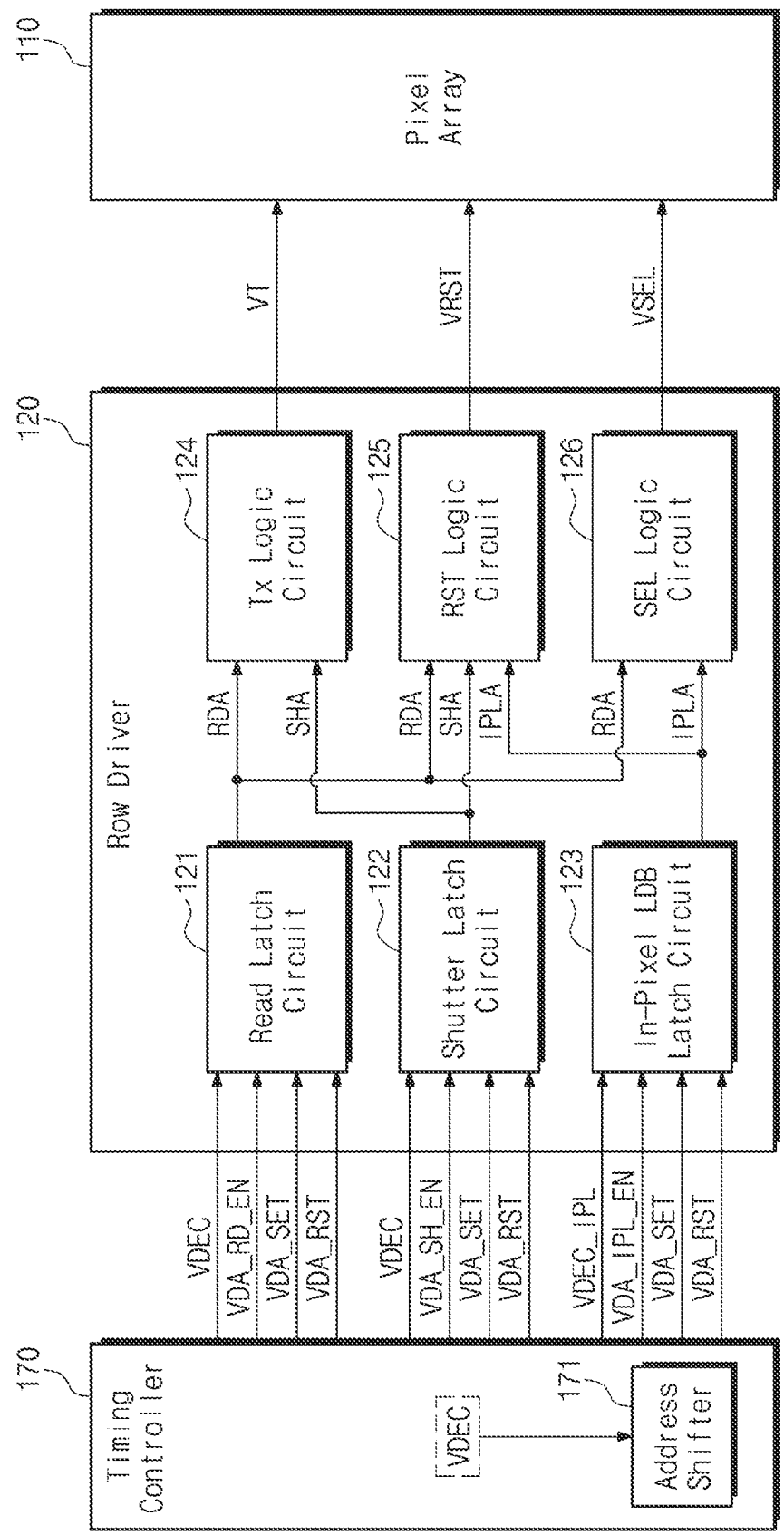
FIG. 8 illustrates an example of a configuration of a row driver of FIG. 2.

FIG. 8 illustrates an example of a configuration of the row driver 120 of FIG. 2. As described with reference to FIG. 2, the row driver 120 may provide the pixel array 110 with the transfer signal VT, the reset signal VRST, and the selection signal VSEL for selecting and driving a row of the pixel array 110 under control of the timing controller 170.

The row driver 120 may include a read latch circuit 121, a shutter latch circuit 122, an IPL latch circuit 123, a transfer logic circuit 124, a reset logic circuit 125, and a selection logic circuit 126. Referring to FIG. 3, the pixel array 110 may be implemented on the first semiconductor substrate SD1, and the row driver 120 and the timing controller 170 may be implemented on the second semiconductor substrate SD2.

The latch circuits 121, 122, and 123 may store addresses, which are generated by the timing controller 170, based on a control signal provided from the timing controller 170 and may provide the addresses to the logic circuits 124, 125, and 126. The logic circuits 124, 125, and 126 may control the pixel array 110 based on the addresses provided from the latch circuits 121, 122, and 123.

The timing controller 170 may generate a vertical decoding signal VDEC and may provide the vertical decoding signal VDEC to the read latch circuit 121 and the shutter latch circuit 122. For example, the vertical decoding signal VDEC may indicate a row address that the read latch circuit 121 and the shutter latch circuit 122 will store (e.g., an address of a row at which the readout operation and the shutter operation will be performed). As described with reference to FIG. 4, the readout operation refers to an operation of reading out data from pixels for the purpose of outputting pixel signals, and the shutter operation refers to an operation of opening a shutter for the pixels to receive light from outside of the electronic device.

The timing controller 170 may include the address shifter 171 that generates an IPL vertical decoding signal VDEC_IPL based on the vertical decoding signal VDEC. For example, the address shifter 171 may generate the IPL vertical decoding signal VDEC_IPL indicating a row address shifted from a row address corresponding to the vertical decoding signal VDEC as much as the given number of rows.

For example, the IPL vertical decoding signal VDEC_IPL may indicate a row address that the IPL latch circuit 123 will store (e.g., an address of a row at which the IPL operation will be performed). For example, the address of the row at which the IPL operation will be performed may be an address shifted from the address of the row at which the readout operation will be performed, as much as the given number of rows. For example, a row of the pixel array 110, at which the IPL operation will be performed, may be one of rows of the pixel array 110, at which the readout operation is already completed.

Also, the timing controller 170 may generate latch enable signals VDA_RD_EN, VDA_SH_EN, and VDA_IPL_EN for activating an operation in which the latch circuits 121, 122, and 123 store and maintain addresses (for example, an operation of determining whether to store and maintain provided addresses). For example, in the case where the latch circuits 121, 122, and 123 according to embodiments of the present disclosure are not provided with the activated latch enable signals VDA_RD_EN, VDA_SH_EN, and VDA_IPL_EN, even though the vertical decoding signal VDEC or the IPL vertical decoding signal VDEC_IPL is provided thereto, the latch circuits 121, 122, and 123 may fail to store corresponding row addresses.

In addition, the timing controller 170 may generate a latch control signal VDA_SET and a latch reset signal VDA_RST for controlling operations of the latch circuits 121, 122, and 123. The latch control signal VDA_SET may allow the latch circuits 121, 122, and 123 to store and maintain a signal (e.g., a row address that the vertical decoding signal VDEC or the IPL vertical decoding signal VDEC_IPL indicates), and the latch reset signal VDA_RST may allow the latch circuits 121, 122, and 123 to be reset.

As described above, for the latch circuits 121, 122, and 123 to store and maintain signals in response to the latch control signal VDA_SET, first, the latch circuits 121, 122, and 123 are to be provided with the activated latch enable signals VDA_RD_EN, VDA_SH_EN, and VDA_IPL_EN.

The read latch circuit 121 may store and maintain an address (hereinafter referred to as a "readout address") of a row of the pixel array 110, at which the read latch circuit 121 will be performed, during a given time, and the shutter latch circuit 122 may store and maintain an address (hereinafter referred to as a "shutter address") of a row of the pixel array 110, at which the shutter operation will be performed, during a given time. Both the read latch circuit 121 and the shutter latch circuit 122 may be provided with the vertical decoding signal VDEC.

For example, the read latch circuit 121 may store and maintain a readout address RDA indicated by the vertical decoding signal VDEC in response to the activated read latch enable signal VDA_RD_EN and the latch control signal VDA_SET, and the shutter latch circuit 122 may store and maintain a shutter address SHA indicated by the vertical decoding signal VDEC in response to the activated shutter latch enable signal VDA_SH_EN and the latch control signal VDA_SET.

After the given time passes, the read latch circuit 121 and the shutter latch circuit 122 may be initialized in response to the latch reset signal VDA_RST. The read latch circuit 121 may provide the readout address RDA to the logic circuits 124, 125, and 126, and the shutter latch circuit 122 may provide the shutter address SHA to the transfer logic circuit 124 and the reset logic circuit 125.

The IPL latch circuit 123 may store and maintain an address (hereinafter referred to as an "IPL address") of a row of the pixel array 110, at which the IPL operation will be performed, during the given time. The IPL latch circuit 123 may be provided with the IPL vertical decoding signal VDEC_IPL. For example, the IPL latch circuit 123 may store and maintain an IPL address IPLA indicated by the IPL vertical decoding signal VDEC_IPL in response to the activated IPL latch enable signal VDA_IPL_EN and the latch control signal VDA_SET. After the given time passes, the IPL latch circuit 123 may be initialized in response to the latch reset signal VDA_RST. The IPL latch circuit 123 may provide the IPL address IPLA to the reset logic circuit 125 and the selection logic circuit 126.

The transfer logic circuit 124 may provide the transfer signal VT to a pixel group located in a row of the pixel array 110, at which the readout operation or the shutter operation will be performed, based on the readout address RDA or the shutter address SHA. The reset logic circuit 125 may provide the reset signal VRST to a pixel group located in a row at which the readout operation, the shutter operation, or the IPL operation will be performed, based on the readout address RDA, the shutter address SHA, or the IPL address IPLA. The selection logic circuit 126 may provide the selection signal VSEL to a pixel group located in a row at which the readout operation or the IPL operation will be performed, based on the readout address RDA or the IPL address IPLA.

Figure 9:
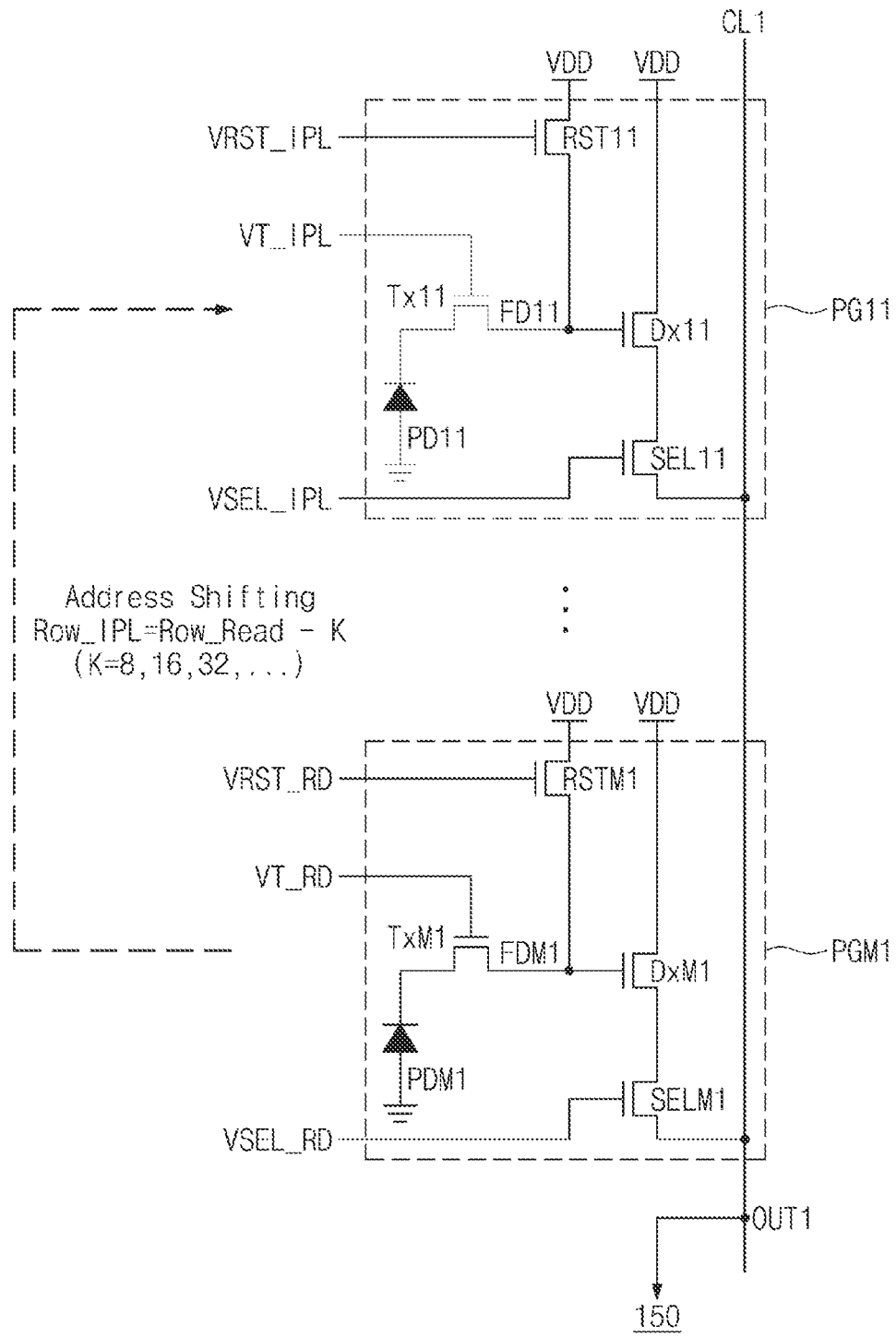
FIG. 9 illustrates an example of a pixel output level control operation by a pixel array of FIG. 2.

FIG. 9 illustrates an example of a pixel output level control operation by the pixel array 110 of FIG. 2. Similar to FIGS. 7A and 7B, for brevity of illustration, it is assumed that each of the pixel groups PG11 and PGM1 includes one photoelectric conversion element PD11 or PDM1 and one transfer transistor Tx11 or TxM1. However, embodiments of the present disclosure are not limited thereto. For example, according to embodiments, the pixel groups PG11 and PGM1 may be implemented as one of the pixel groups illustrated in FIGS. 4 to 6.

Also, for convenience of illustration, in FIG. 9, only one pixel group is illustrated for each row. In FIG. 9, it is assumed that the readout operation is performed in the pixel group PGM1 and the IPL operation is performed in the pixel group PG11. Below, the description will be given with reference to FIGS. 8 and 9 together.

A voltage level of the column line CL1 connected to the pixel group PGM1 that is generating a pixel signal (e.g., is performing the readout operation) may be adjusted to a desired voltage level, based on the IPL operation of the pixel group PG11 that (1) is located in another row (e.g., row 1) adjacent to the pixel group PGM1, (2) is not generating a pixel signal (e.g., whose readout operation is already completed), and (3) is connected to the same column line CL1, before the select transistor SELM1 is turned on.

For example, before the select transistor SELM1 is turned on, the voltage level of the column line CL1 may be adjusted to be about equal to that of the remaining column lines (e.g., CL2 to CLN of FIGS. 7A and 7B) through the IPL operation of the pixel group PG11, which complies with the control of the row driver 120 and the timing controller 170.

The pixel group that performs the IPL operation may be a pixel group whose readout operation is already completed. For example, the pixel group that performs the IPL operation may be a pixel group located in a row Row_IPL shifted from a row Row_Read, at which the pixel group performing the read operation is located, as much as the given number "K" of rows (K being 8, 16, 32, . . . ) (Row_IPL=Row_Read−K).

The row Row_Read at which the pixel group to perform the readout operation is located may be determined by the readout address RDA that is based on the vertical decoding signal VDEC, and the logic circuits 124, 125, and 126 may provide the control signals VT_RD, VRST_RD, and VSEL_RD to the pixel group located in the row Row_Read. The row Row_IPL at which the pixel group to perform the IPL operation is located may be determined by the IPL address IPLA that is based on the IPL vertical decoding signal VDEC_IPL, and the reset logic circuit 125 and the selection logic circuit 126 may provide the control signals VRST_IPL and VSEL_IPL to the pixel group located in the row Row_IPL.

In some cases, the readout address RDA and the IPL address IPLA corresponding to the same row may be simultaneously provided to the selection logic circuit 126. In this case, the selection logic circuit 126 may be configured to first output the selection signal VSEL_RD associated with the readout operation and to then output the selection signal VSEL_IPL associated with the IPL operation.

For example, while the select transistor SELM1 of the pixel group PGM1 to perform the readout operation is turned off in response to the selection signal VSEL_RD of the low level, the select transistor SEL11 of the pixel group PG11 to perform the IPL operation may be turned on in response to the selection signal VSEL_IPL of the high level.

The turned-on select transistor SEL11 may adjust a voltage level of the column line CL1 based on a voltage level of the reset floating diffusion region FD11. Similar to the case where the readout operation is performed, the floating diffusion region FD11 may be reset when the reset transistor RST11 is turned on in response to the reset signal VRST_IPL.

Next, while the select transistor SELM1 is turned on in response to the selection signal VSEL_RD of the high level, the select transistor SEL11 may be turned off in response to the selection signal VSEL_IPL of the low level. When the select transistor SELM1 is again turned off in response to the selection signal VSEL_RD of the low level, the select transistor SEL11 may be again turned on in response to the selection signal VSEL_IPL of the high level, and the voltage level of the column line CL1 may be adjusted based on the voltage level of the re-reset floating diffusion region FD11.

For example, according to an embodiment of the present disclosure, as a select transistor of a pixel group to perform the IPL operation is turned on while a select transistor of a pixel group under the readout operation is turned off, a voltage level of a column line (e.g., a pixel output level) may be adjusted based on a voltage level of a reset floating diffusion region. The above method may replace the pixel output level control method using the line disconnection circuit 140, which is described with reference to FIG. 7, and settling times of column lines may be uniformly adjusted. Accordingly, the accuracy of correlated double sampling may be increased, and a decrease in the dynamic range may be prevented or reduced.

Figure 10:
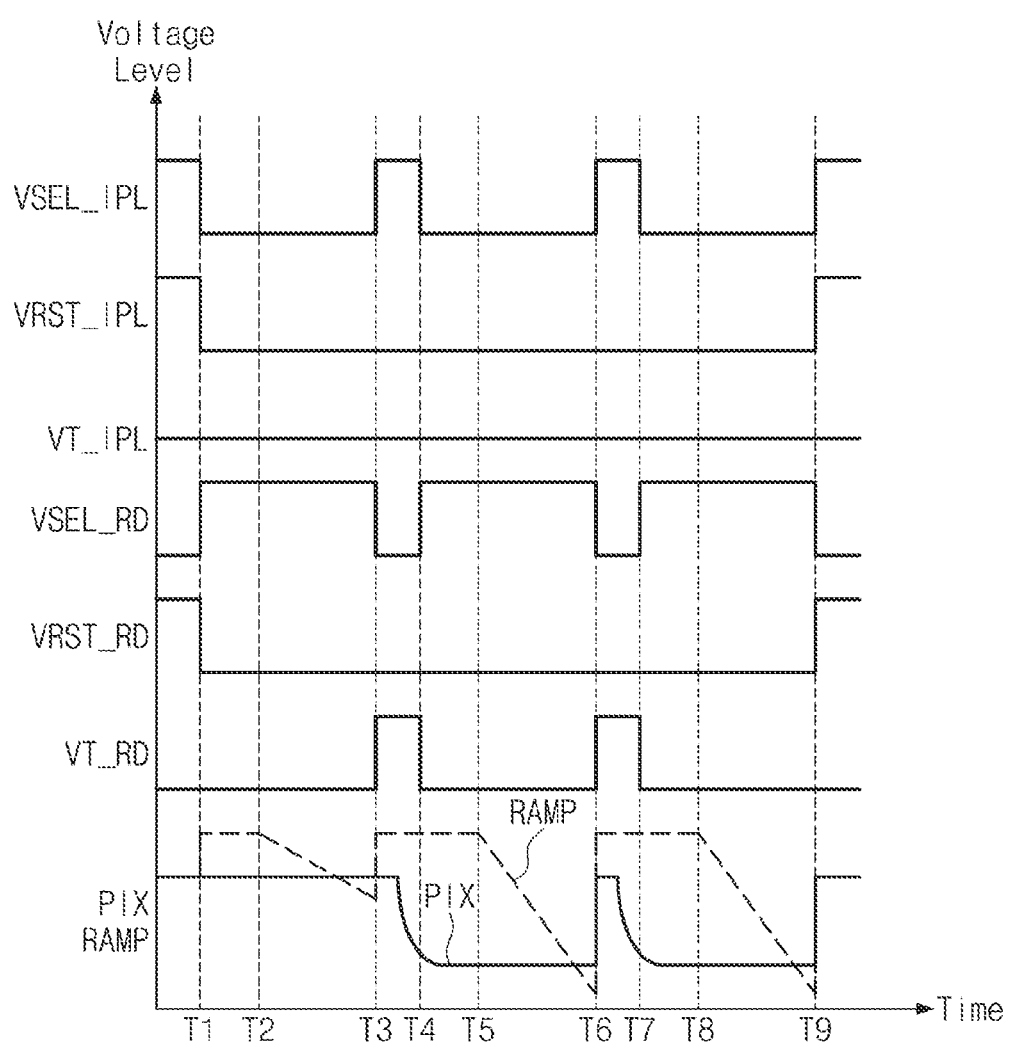
FIG. 10 is a timing diagram illustrating a pixel output level control operation according to embodiments of the present disclosure.

FIG. 10 is a timing diagram illustrating a pixel output level control operation according to embodiments of the present disclosure. The timing diagram of FIG. 10 may be associated with an operation of a pixel group having a structure in which the pixels PX1 and PX2 include the photoelectric conversion elements PD1 and PD2, respectively. Also, as in the above description given with reference to FIG. 9, it is assumed that the readout operation is performed on the pixel groups PGM1 to PGMN at the M-th row and the IPL operation is performed on the pixel groups PG11 to PG1N at the first row. Below, operations associated with the pixel array 110 illustrated in FIGS. 7A, 7B, and 9 will be described with reference to FIG. 10.

Before time T1, the reset transistors RST11 to RST1N of the pixel groups PG11 to PG1N to perform the IPL operation may be turned on, and thus, voltages of the floating diffusion regions FD11 to FD1N may be reset. At time T1, the select transistors SELM1 to SELMN of the pixel groups PGM1 to PGMN to perform the readout operation may be turned on in response to the selection signal VSEL_RD of the high level.

At time T1, the select transistors SEL11 to SEL1N may be turned off in response to the selection signal VSEL_IPL of the low level. To perform digital conversion on reset signals of the pixel groups PGM1 to PGMN, an offset may be applied to the ramp signal RAMP at time T1, and the ramp signal RAMP may decrease from time T2.

At time T3, the select transistors SELM1 to SELMN of the pixel groups PGM1 to PGMN to perform the readout operation may be turned off in response to the selection signal VSEL_RD of the low level, which may prevent the coupling by the transfer signal VT_RD of the high level. In this case, the select transistors SEL11 to SEL1N of the pixel groups PG11 to PG1N to perform the IPL operation may be turned on in response to the selection signal VSEL_IPL of the high level, and voltage levels of the column lines CL1 to CLN may be adjusted based on voltage levels of the reset floating diffusion regions FD11 to FD1N.

In the case where the digital conversion for the reset signal ends, to convert an image signal of the pixel signal PIX into a digital signal, an offset may again be applied to the ramp signal RAMP at time T3. Also, at time T3, the transfer transistors TxM1 to TxMN may be turned on in response to the transfer signal VT_RD of the high level, and charges generated by the photoelectric conversion elements PDM1 to PDMN may start to be transferred to the floating diffusion regions FDM1 to FDMN. For example, charges that are transferred to each of the floating diffusion regions FDM1 to FDMN at time T3 may be charges generated by one of the two photoelectric conversion elements PD1 and PD2 that the pixel group PG of FIG. 4 includes.

At time T4, the transfer transistors TxM1 to TxMN may be turned off again in response to the transfer signal VT_RD of the low level, and the select transistors SELM1 to SELMN may be turned on again in response to the selection signal VSEL_RD of the high level. At time T4, the select transistors SEL11 to SEL1N of the pixel groups PG11 to PG1N to perform the IPL operation may be turned off again in response to the selection signal VSEL_IPL of the low level.

From time T5, a level of the ramp signal RAMP may decrease to perform digital conversion on an image signal. In a period from time T5 to time T6, the image signal of the pixel signal PIX and the ramp signal RAMP may be compared. In the period from time T5 to time T6, the select transistors SEL11 to SEL1N of the pixel groups PG11 to PG1N to perform the IPL operation may continuously be in a turn-off state.

At time T6 at which the image signal of the pixel signal PIX and the ramp signal RAMP are completely compared, the select transistors SELM1 to SELMN of the pixel groups PGM1 to PGMN in which the readout operation is performed may be turned off again in response to the selection signal VSEL_RD of the low level. In this case, the select transistors SEL11 to SEL1N of the pixel groups PG11 to PG1N to perform the IPL operation may be turned on again in response to the selection signal VSEL_IPL of the high level, and voltage levels of the column lines CL1 to CLN may be adjusted based on the voltage levels of the reset floating diffusion regions FD11 to FD1N.

Like time T3, an offset may be applied to the ramp signal RAMP at time T6. Also, at time T6, the transfer transistors TxM1 to TxMN may be turned on in response to the transfer signal VT_RD of the high level, and charges generated by the photoelectric conversion elements may start to be transferred to the floating diffusion regions FDM1 to FDMN. For example, charges that are transferred to each of the floating diffusion regions FDM1 to FDMN at time T6 may be charges generated by all of the two photoelectric conversion elements PD1 and PD2 that the pixel group PG of FIG. 4 includes.

Operations from time T7 to time T9 may be the same as the above operations from time T4 to time T6. At time T7, the transfer transistors TxM1 to TxMN of the pixel groups PGM1 to PGMN to perform the readout operation may be turned off again, and the select transistors SEL11 to SEL1N of the pixel groups PG11 to PG1N to perform the IPL operation may be turned off again in response to the selection signal VSEL_IPL of the low level. A level of the ramp signal RAMP may start to decrease from time T8, and a comparison operation may be completed at time T9.

At time T9, the select transistors SELM1 to SELMN of the pixel groups PGM1 to PGMN to perform the readout operation may be turned off. The reset transistors RSTM1 to RSTMN may be turned on in response to the reset signal VRST_RD of the high level, and the floating diffusion regions FDM1 to FDMN may be reset. The timing of the readout operation and the IPL operation in the pixel array 110 according to an embodiment of the present disclosure is described with reference to FIG. 10, but embodiments of the present disclosure are not limited thereto. For example, the timing of signals may be modified based on different implementations.

Figure 11:
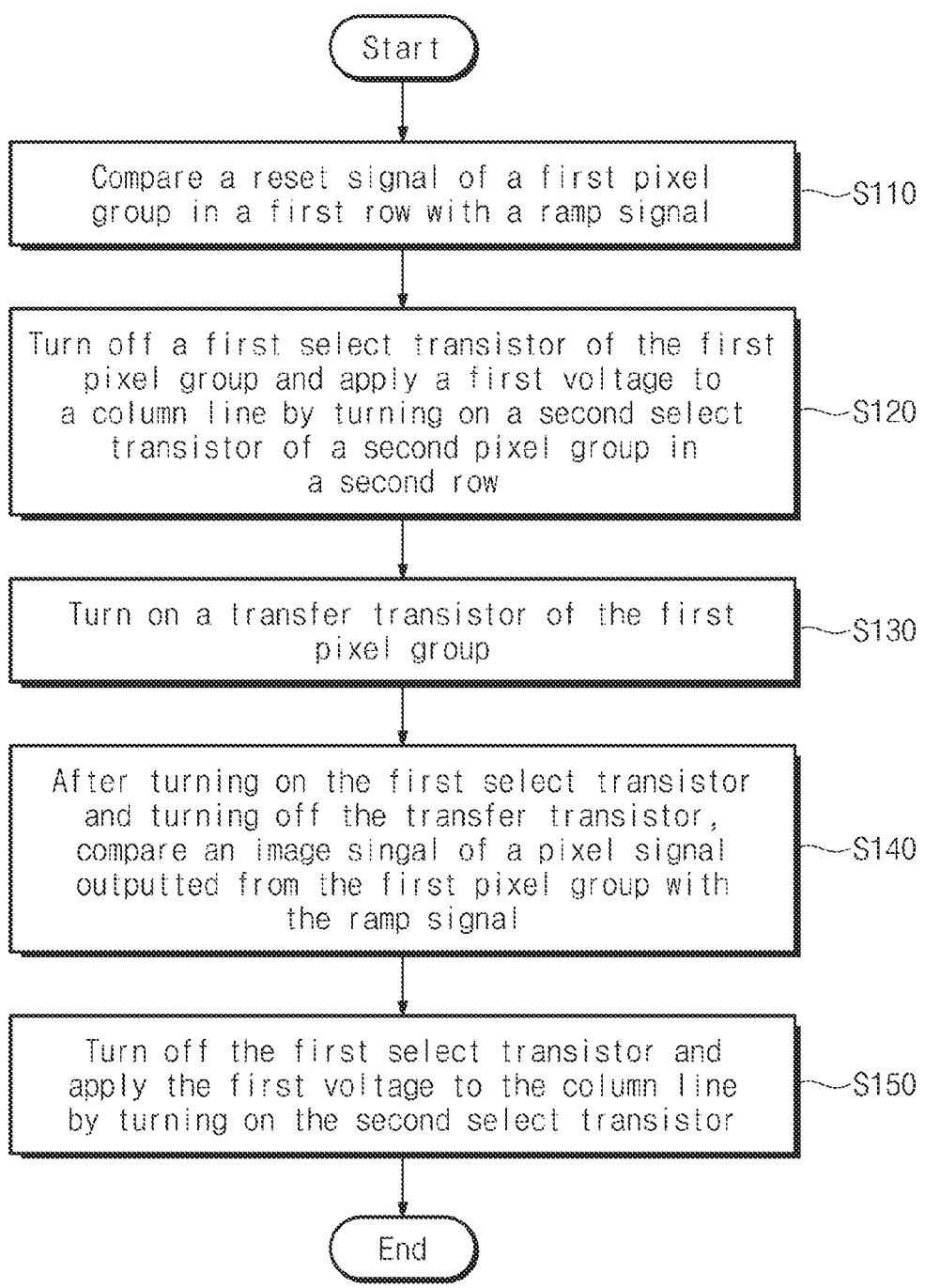
FIG. 11 is a flowchart illustrating an example of an operating method of an image sensor for controlling a pixel output level according to an embodiment of the present disclosure.

FIG. 11 is a flowchart illustrating an example of an operating method of an image sensor for controlling a pixel output level according to an embodiment of the present disclosure. FIG. 11 will be described with reference to FIGS. 2, 9, and 10 together.

In operation S110, the image sensor 100 may compare a reset signal and the ramp signal RAMP. In operation S120, the image sensor 100 may turn off the select transistors SELM1 to SELMN of the pixel groups PGM1 to PGMN that will perform the readout operation and may turn on the select transistors SEL11 to SEL1N of the pixel groups PG11 to PG1N that will perform the IPL operation, and thus, voltage levels of the column lines CL1 to CLN may be adjusted to a given voltage level. For example, the given voltage level may be determined based on voltage levels of the reset floating diffusion regions FD11 to FD1N of the pixel groups PG11 to PG1N.

In operation S130, the image sensor 100 may turn on the transfer transistors TxM1 to TxMN of the pixel groups PGM1 to PGMN that will perform the readout operation. In operation S140, the image sensor 100 may turn on the select transistors SELM1 to SELMN, may turn off the transfer transistors TxM1 to TxMN, and may then compare an image signal of the pixel signal PIX and the ramp signal RAMP.

In operation S150, the image sensor 100 may again turn off the select transistors SELM1 to SELMN of the pixel groups PGM1 to PGMN that will perform the readout operation and may again turn on the select transistors SEL11 to SEL1N of the pixel groups PG11 to PG1N that will perform the IPL operation, and thus, voltage levels of the column lines CL1 to CLN may be adjusted to the given voltage level.

According to an embodiment of the present disclosure, voltage levels of column lines may be prevented from having different settling times.

Accordingly, according to an embodiment of the present disclosure, the accuracy of correlated double sampling (CDS) for each column line may be increased, and a decrease in a dynamic range of an image sensor may be prevented or reduced. Also, a speed at which a pixel signal is output may be increased.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An image sensor, comprising:
 a pixel array comprising a first pixel group located in a first row and comprising a first select transistor and a first floating diffusion region, a second pixel group located in a second row and comprising a second select transistor and a second floating diffusion region, and a column line connected to both the first pixel group and the second pixel group, wherein, while charges generated by a photoelectric conversion element of the first pixel group are transferred to the first floating diffusion region, the first select transistor is turned off, the second select transistor is turned on, and a first voltage is applied to the column line through the second select transistor, and wherein a photoelectric conversion element of the second pixel group generates charges prior to the photoelectric conversion element of the first pixel group, and the charges generated by the photoelectric conversion element of the second pixel group are transferred to the second floating diffusion region.

2. The image sensor of claim 1, wherein the pixel array further comprises:

a third pixel group located in a third row and comprising a third select transistor and a third floating diffusion region, wherein the first to third rows are disposed in an order of the second row, the first row, and the third row, wherein, while charges integrated by a photoelectric conversion element of the third pixel group are transferred to the third floating diffusion region, the third select transistor is turned off, and a second voltage is applied to the column line through the first select transistor, and wherein the photoelectric conversion element of the first pixel group generates charges prior to the photoelectric conversion element of the third pixel group, and the charges generated by the photoelectric conversion element of the first pixel group are transferred to the first floating diffusion region.

3. The image sensor of claim 1, wherein the first voltage is determined based on a voltage level of a reset second floating diffusion region of the second pixel group.

4. The image sensor of claim 1, wherein the second select transistor is turned off when the first select transistor is turned on, the second select transistor is turned on when the first select transistor is turned off, and the first voltage is applied to the column line through the second select transistor.

5. The image sensor of claim 1, wherein each of the first pixel group and the second pixel group comprises a color filter and two pixels, wherein the two pixels of the first pixel group share the first floating diffusion region and the two pixels of the second pixel group share the second floating diffusion region, and wherein the two pixels comprise photoelectric conversion elements, respectively.

6. The image sensor of claim 5, further comprising:

a row driver configured to generate control signals that control each row of the pixel array, wherein the generated control signals are provided to the first pixel group and the second pixel group; and a timing controller configured to control the row driver, wherein, while charges generated by the photoelectric conversion elements of the first pixel group are transferred to the first floating diffusion region based on the control signals, the row driver turns off the first select transistor, turns on the second select transistor, and applies the first voltage to the column line through the second select transistor based on the control signals, and wherein an address of the second row is determined based on an address of the first row.

7. The image sensor of claim 6, wherein the first voltage is determined based on a voltage level of a reset second floating diffusion region of the second pixel group.

8. The image sensor of claim 6, wherein the timing controller comprises:

an address shifter configured to generate the address of the second row by shifting the address of the first row.

9. The image sensor of claim 6, wherein the row driver comprises:

a first latch circuit configured to receive the address of the first row from the timing controller;

a second latch circuit configured to receive the address of the second row from the timing controller; and a plurality of logic circuits configured to receive the address of the first row and the address of the second row from the first latch circuit and the second latch circuit and to provide the control signals to the first pixel group and the second pixel group.

10. The image sensor of claim 9, wherein the second select transistor is turned off when the first select transistor is turned on, the second select transistor is turned on when the first select transistor is turned off, and the first voltage is applied to the column line through the second select transistor.

11. The image sensor of claim 10, wherein the logic circuits comprise:

a selection logic circuit configured to output a first selection control signal to the first select transistor in response to the address of the first row and to output a second selection control signal to the second select transistor in response to the address of the second row, and wherein the first select transistor is turned on or turned off in response to the first selection control signal and the second select transistor is turned on or turned off in response to the second selection control signal.

12. The image sensor of claim 6, further comprising:

a line disconnection circuit comprising a transistor connected to the column line and configured to adjust a voltage level of the column line to a given voltage level, wherein the transistor is turned off when the first select transistor is turned on, and wherein, when the first select transistor is turned off, the transistor is turned on such that the voltage level of the column line is adjusted to a second voltage.

13. The image sensor of claim 12, wherein the timing controller comprises a register, wherein, depending on a value stored in the register, the first voltage is applied to the column line by using the second select transistor, or the voltage level of the column line is adjusted to the second voltage by using the line disconnection circuit.

14. The image sensor of claim 12, further comprising:

a first semiconductor substrate; and a second semiconductor substrate, wherein the first semiconductor substrate and the second semiconductor substrate are stacked in a vertical direction such that the first semiconductor substrate and the second semiconductor substrate are electrically connected to each other, and wherein the pixel array is formed on the first semiconductor substrate, and the row driver, the timing controller, and the line disconnection circuit are formed on the second semiconductor substrate.

15. An image sensor, comprising:

a pixel array comprising a first pixel group located in a first row, comprising a first select transistor, and corresponding to a first color filter, a second pixel group located in a second row, comprising a second select transistor, and corresponding to a second color filter, and a column line connected to both the first pixel group and the second pixel group;

a row driver configured to generate control signals that control each row of the pixel array, wherein the generated control signals are provided to the first pixel group and the second pixel group; and a timing controller configured to control the row driver, wherein a first unit pixel group of the first pixel group shares a first floating diffusion region, a second unit pixel group of the first pixel group shares a second floating diffusion region, and a third unit pixel group of the first pixel group shares a third floating diffusion region, wherein, while charges generated by photoelectric conversion elements of the first pixel group are transferred to the first to the third floating diffusion regions based on the control signals, the row driver turns off the first select transistor, turns on the second select transistor, and applies a first voltage to the column line through the second select transistor, wherein photoelectric conversion elements of the second pixel group generate charges prior to the photoelectric conversion elements of the first pixel group, and the charges generated by the photoelectric conversion elements of the second pixel group are transferred to corresponding floating diffusion regions, and wherein an address of the second row is determined based on an address of the first row.

16. The image sensor of claim 15, wherein the first voltage is determined based on a voltage level of reset floating diffusion regions of the second pixel group.

17. The image sensor of claim 15, wherein the timing controller comprises:

an address shifter configured to generate the address of the second row by shifting the address of the first row.

18. The image sensor of claim 15, wherein the row driver comprises:

a first latch circuit configured to receive the address of the first row from the timing controller;

a second latch circuit configured to receive the address of the second row from the timing controller; and a plurality of logic circuits configured to receive the address of the first row and the address of the second row from the first latch circuit and the second latch circuit and to provide the control signals to the first pixel group and the second pixel group.

19. The image sensor of claim 18, wherein the second select transistor is turned off when the first select transistor is turned on, the second select transistor is turned on when the first select transistor is turned off, and the first voltage is applied to the column line through the second select transistor.

20. The image sensor of claim 19, wherein the logic circuits comprise:

a selection logic circuit configured to output a first selection control signal to the first select transistor in response to the address of the first row and to output a second selection control signal to the second select transistor in response to the address of the second row, and wherein the first select transistor is turned on or turned off in response to the first selection control signal and the second select transistor is turned on or turned off in response to the second selection control signal.

* * * * *